United States Patent [19]
Nagatuma et al.

[11] 3,993,534
[45] Nov. 23, 1976

[54] METHOD OF PRODUCING SINGLE CRYSTALS OF GADOLINIUM MOLYBDATE FAMILY

[75] Inventors: Kazuyuki Nagatuma, Hachioji; Seikichi Akiyama, Kokubunji; Hirotugu Kozuka, Tokyo; Masayoshi Kobayashi, Hachioji, all of Japan

[73] Assignee: Hitachi, Ltd., Japan

[22] Filed: Jan. 3, 1975

[21] Appl. No.: 538,336

Related U.S. Application Data

[62] Division of Ser. No. 440,359, Feb. 7, 1974, Pat. No. 3,894,846.

[30] Foreign Application Priority Data
Feb. 7, 1973 Japan.............................. 48-14651
Oct. 31, 1973 Japan............................ 48-121671

[52] U.S. Cl. .......................... 156/617 SP; 156/624; 23/305 RE; 156/DIG. 63; 423/263; 423/593; 156/DIG. 73
[51] Int. Cl.² ..................... B01D 9/00; C01G 39/00; C01G 57/00
[58] Field of Search ............................ 156/617–620, 156/624, DIG. 63, DIG. 73; 423/606, 607, 624, 21, 263, 593; 252/301.4 R; 23/305 RE

[56] References Cited
UNITED STATES PATENTS

| | | | |
|---|---|---|---|
| 3,328,311 | 6/1967 | Borchardt | 23/305 RE |
| 3,775,066 | 3/1973 | Yumoto | 156/624 X |
| 3,836,632 | 9/1974 | Akiyama | 23/305 RE |
| 3,894,142 | 7/1975 | Akiyama | 23/305 RE |

*Primary Examiner*—Norman Yudkoff
*Assistant Examiner*—S. J. Emery
*Attorney, Agent, or Firm*—Craig & Antonelli

[57] ABSTRACT

A method of producing the single crystals of the gadolinium molybdate family having a high transmission and low threshold field, comprising the step of growing a single crystal from a melt of the gadolinium molybdate family by a crystal pulling technique, the step of cooling slowly the single crystal in a temperature range of from immediately below a melting point to a segregation temperature of $\alpha$ phase of the single crystal and the further step of cooling under such cooling conditions that the $\alpha$ phase is not segregated and the value of the threshold field of the single crystal is not made large in a temperature range of below the segregation temperature of the $\alpha$ phase.

5 Claims, 17 Drawing Figures

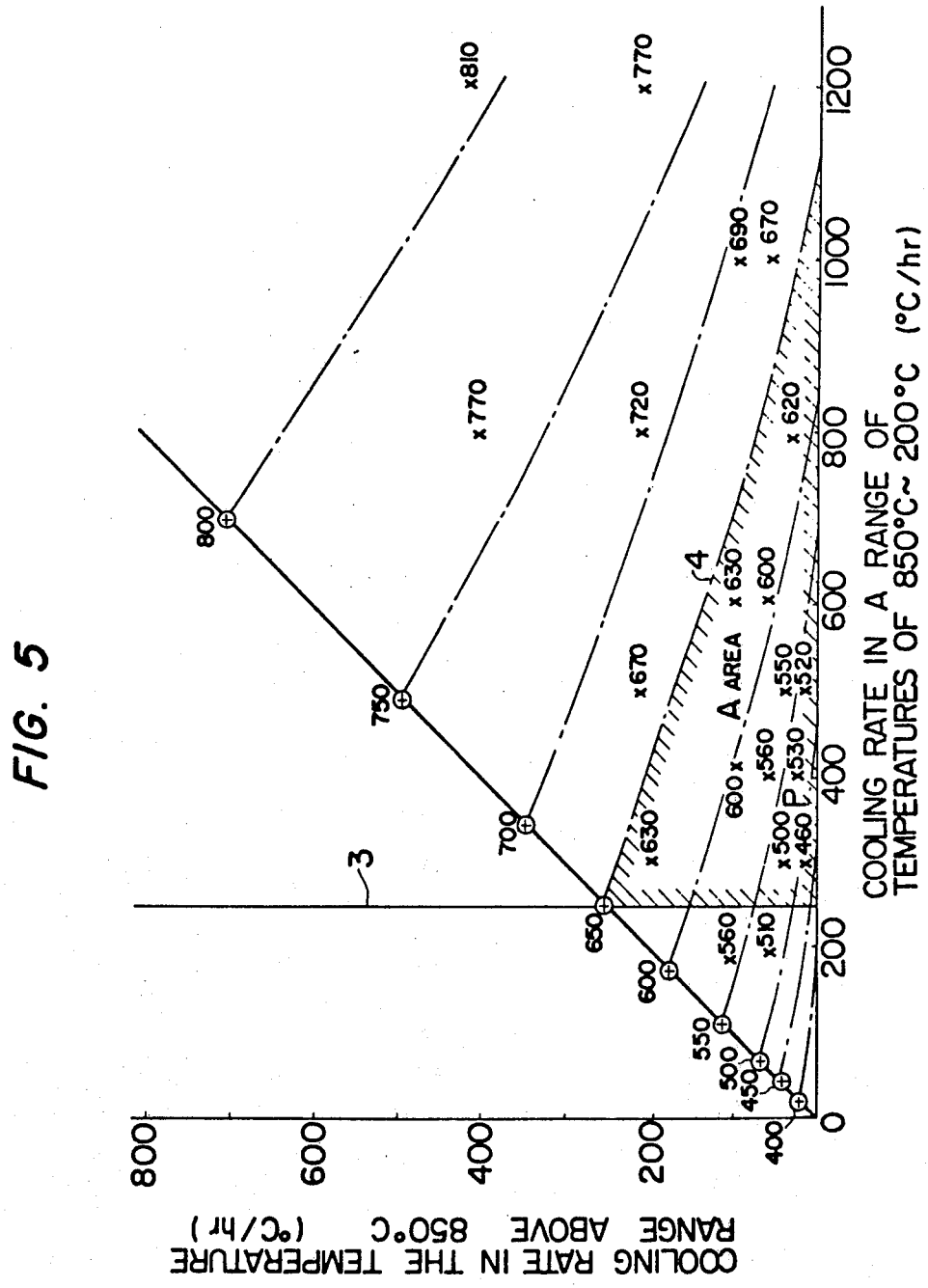

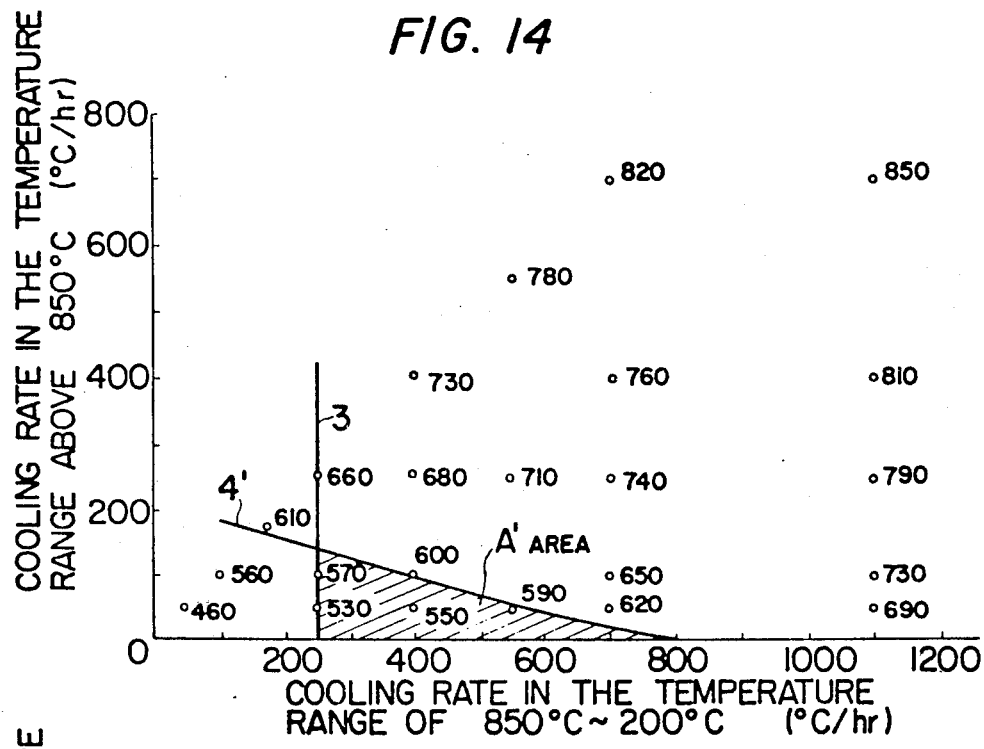
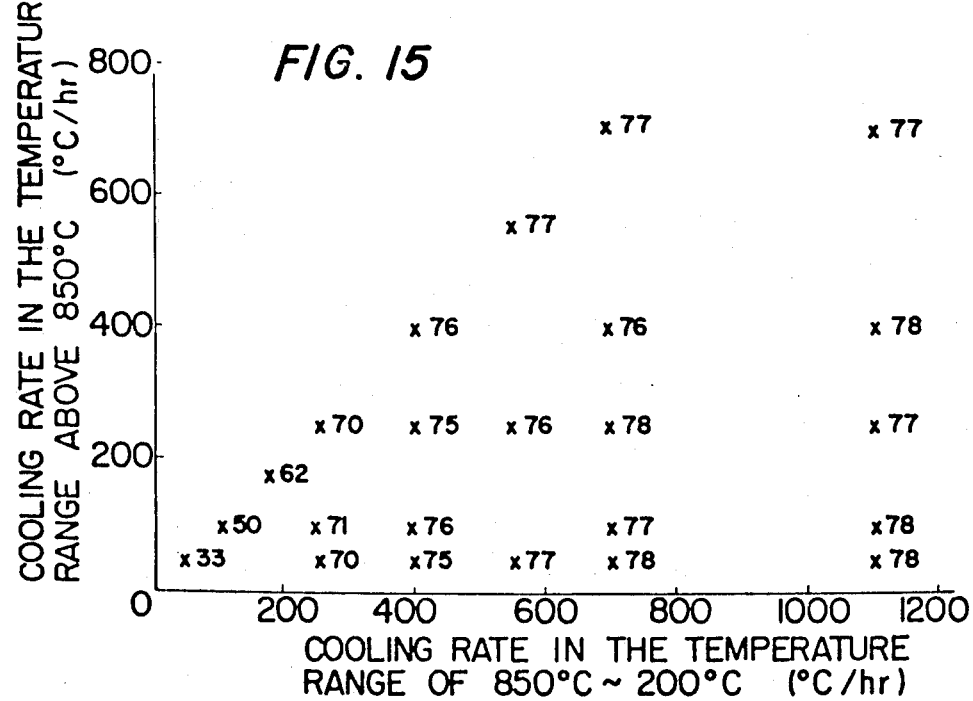

METHOD OF PRODUCING SINGLE CRYSTALS OF GADOLINIUM MOLYBDATE FAMILY

This is a division of application Ser. No. 440,359, filed Feb. 7, 1974, now U.S. Pat. No. 3,894,846, issued July 15, 1975.

BACKGROUND OF THE INVENTION

1. Field of the Invention

The present invention relates to a method of producing single crystals of the gadolinium molybdate family, more particularly the single crystals having a high transmission and a low threshold field.

2. Description of the Prior Art

The single crystals of gadolinium molybdate family are generally ferroelectric and ferroelastic and have a high transmission. Consequently, these crystals provide very excellent characteristics when they are used as an optical material.

And it is well known that in order to obtain the single crystals of gadolinium molybdate family having good quality, a technique of growing a single crystal from a melt at high temperature according to a pull technique (which is generally known as "Czochralski method") is used.

In this technique, the single crystals of gadolinium molybdate family, for example, a gadolinium molybdate ($Gd_2(MoO_4)_3$) single crystal, are produced by heat-melting a polycrystal of gadolinium molybdate or a mixture consisting of molybdenum oxide and gadolinium oxide which is so compounded as to satisfy a stoichiometric value as constitutes gadolinium molybdate, by immersing a seed crystal in the resultant melt, by growing the single crystal of gadolinium molybdate with the crystal pulling technique, and thereafter by cooling the single crystal from a high temperature to room temperature.

But, if the cooling rate in the cooling process is low, then the crystal becomes whitish, becomes low in light transmission and cannot be put to an optical application.

With note taken of the relationship between the cooling rate and the whitening of the crystal, the inventors have previously proposed a method in which the cooling rate in the cooling process after growing the gadolinium molybdate single crystal from the melt by the crystal pulling technique is made large, thereby to produce an optical material of sufficiently high transmission.

On the other hand, when the gadolinium molybdate single crystal is to be employed as the material of an electro-optical element such as optical shutter, light modulator and color modulator, it is desired that besides a high transmission that the threshold field is low while the mobility is high. Herein, the terms "threshold field" and "mobility" mean the point (1) of intersection with the axis of abscissas as obtained by the extrapolation and the inclination tan $\theta$ of a characteristic straight line, respectively, in the characteristic of electric fields — transfer velocity of a polarization wall (wall velocity) as shown in FIG. 1.

But the gadolinium molybdate single crystal obtained by the process mentioned above has a large threshold field, therefore it cannot be used in an electro-optical application.

SUMMARY OF THE INVENTION

The primary object of this invention is to provide a method in which the single crystals of gadolinium molybdate family having a high transmission and a low threshold field are produced.

Another object of this invention is to provide a method in which single crystals of gadolinium molybdate family that may be employed as a material of the electro-optical element are produced.

Still another object of this invention is to provide a method in which the single crystals of gadolinium molybdate family are produced by specifically giving appropriate conditions in the cooling process thereof.

Yet another object of this invention is to provide a method in which the single crystals of gadolinium molybdate family having a high transmission and a low threshold field from the single crystal manufactured by the steps of heat-melting polycrystal of gadolinium molybdate or a mixture consisting of molybdenum oxide and oxide of one of the group consisting of gadolinium, europium, dysprosium and terbium that is so compounded as to satisfy a stoichiometric composition as constitutes molybdate, immersing a seed crystal in the melt obtained, and growing the single crystal of molybdate by the crystal pulling technique.

A further object of this invention is to provide a method in which single crystals of gadolinium molybdate family having a high transmission and a low threshold field are obtained from the single crystal having larger threshold field in a wall transfer.

In order to accomplish the above-mentioned objects, the method of producing single crystals of gadolinium molybdate family of the present invention is characterized by comprising the step of growing the single crystal from a melt of the gadolinium molybdate family by the crystal pulling technique; the step of cooling slowly the single crystals in a temperature range of from immediately below a melting point to a segregation temperature of the $\alpha$ phase of the single crystal and the further step of cooling under cooling conditions such that the $\alpha$ phase is not segregated and the value of the threshold field of the single crystal is not made large in a temperature range below the segregation temperature of the $\alpha$ phase.

According to recent researches by the inventors, between the threshold field and the cooling rate in the cooling process after growing the single crystals of the gadolinium molybdate family from the melt by the crystal pulling technique, there is the relation that as the cooling rate is larger, the threshold field is higher. Between the threshold field and the mobility, there is the relationship that as the threshold field is lower, the mobility is higher.

That is, when a single crystal of the gadolinium molybdate family is intended to be used as a material of an electro-optical element, there arises the conflict that while the cooling rate in the cooling process need be made large in order to achieve a single crystal of high transmission as mentioned above, the cooling rate needs to be made small in order to achieve the single crystal of low threshold field; the cooling process being performed from the high temperature to room temperature after hot-melting the polycrystal of gadolinium molybdate family (or a mixture consisting of molybdenum oxide and oxide of one of the group consisting of gadolinium, europium, dysprosium and terbium that is so compounded as to satisfy the stoichiometric value as constitutes gadolinium molybdate family) and after growing the single crystal of gadolinium molybdate family by the crystal pulling technique with the seed crystal immersed in the resultant melt.

According to researches by the inventors and by E.T. Keve et al., Solid E. T. Communication 8 (1970) 1517, the thermodynamic stable phase of gadolinium molybdate below 850° C is the $\alpha$ phase, while the phase to be used for the material of the electro-optical element is the metastable phase. However, it is presumed that it takes about 25,000 years for this phase to be transited to the $\alpha$ phase at room temperature, and it has been revealed that this phase may practically be handled as the stable phase.

The relationship between the transmission or the threshold field, and the cooling rate are shown hereinafter.

Powder of 1 mole of gadolinium oxide and 3 moles of molybdenum oxide compounded was sufficiently ground and mixed. In a platinum crucible, the powder was gradually heated for at least 36 hours, and it was melted at 1,160° C. Subsequently, a seed crystal having [110] direction was fixed to a platinum holder, and it was immersed in the melt. While the holder was being rotated at a number of revolutions of 120 r.p.m., it was pulled up at the pull-up rate of 14 mm/hr. to grow a cylindrical single crystal of gadolinium molybdate being about 15 mm. in diameter and about 50 mm. in length. Thereafter, the single crystal was cut away from the melt. After the crystal was held at about 1,000° C, it was cooled down to 200° C. immediately before the Curie point (approximately 160° C.) at a constant cooling rate and then cooled down to the room temperature at the cooling rate of 120° C/hr.

The transmission of the single crystal thus obtained is plotted as the function of the cooling rate in FIG. 2. In this Figure, the transmission is depicted as a ratio of transmissive light quantity to incident light quantity per 1 cm. in thickness. In FIG. 2, line 2 depicts the transmission in the case the light absorption of the single crystal is zero. The transmission increases more as the cooling rate is greater, but it has a substantially constant value above 400° C/hr. In general, the transmission of at least 70% is required for use of a material of an electro-optical element. As apparent from FIG. 2, the cooling rate need be at least 250° C./hr. in order to render the transmission 75% or higher. Here, for the measurements of the transmission, a He-Ne laser having an output of 5 mW and a wavelength of 6,328A was used as a light source, and the thickness of specimen was made 1 cm.

The relationship between the threshold field and the cooling rate is illustrated in FIG. 3. As the cooling rate becomes greater, the threshold field increases. The threshold field at the cooling rate of 800° C./hr. is twice as high as that at the cooling rate of 20° C./hr. It can therefore be concluded that the cooling rate cannot be made very large in order to apply the single crystal to a low-voltage light value. Here, the measurements of the threshold fields were carried out in such way that positive and negative pulse voltages were applied to specimens of a thickness of 0.8 mm. as obtained by cutting the produced single crystal and subjecting the sliced pieces to optical polishing and the current waveforms of polarization reversal flowing through an electric resistance connected in series with the specimens were read by means of a memory scope.

The X-ray diffraction peaks of a single crystal at various cooling rates are as shown in FIGS. 4(a)–4(c). In FIG. 4(a), the X-ray diffraction peaks of a single crystal which became whitish at a very small cooling rate is shown, and in FIG. 4(b), the X-ray diffraction peaks of a single crystal which was sufficiently transparent at a large cooling rate is shown. Here, the K$\alpha$-rays of Cu was used as an X-ray source, and an X-ray diffractometer was used as a detector. By comparing FIGS. 4(a) and 4(b), it is seen that FIG. 4(a) includes X-ray diffraction peaks not present in FIG. 4(b). Something corresponding to these X-ray diffraction peaks is considered to be the substance which induces the whitening. On the other hand, when the process till the heat-melting of the powdery raw material is examined, X-ray diffraction peaks appearing only in a temperature range of from the room temperature to 850° C. are noted. These X-ray diffraction peaks are shown in FIG. 4(c). These X-ray diffraction peaks correspond to the so-called $\alpha$ phase which is the thermodynamic theoretical stable phase at temperatures below 850° C. It can be considered that the X-ray diffraction peaks in FIG. 4(c) and those in FIG. 4(b) as added up are the X-ray diffraction peaks in FIG. 4(a).

That is, it can be concluded that the whitening arising when the cooling rate is small is the segregation of the so-called $\alpha$ phase of gadolinium molybdate as occurs below 850° C. This means that the cooling rate in the range of temperatures froom the high temperature to 850° C exerts no influence on the transmission, and FIG. 2 is nothing but a representation of the relationship between the cooling rate and transmission in the range of temperatures below 850° C.

It has been understood from the results mentioned above that the transmission is determined by the cooling rate in the temperature range below 850° C (the segregation temperature of $\alpha$ phase of gadolinium molybdate). On the other hand, it is seen from FIG. 3 that in the case of cooling the crystal at the constant cooling rate from about 1,000° C. to the temperature immediately before the Curie point, when the cooling rate is small the threshold field is small. Considering the crystal thermo-dynamically, it can be well conjectured or realized that the cooling rate at high temperatures will have a greater influence on the threshold field than the cooling rate at low temperatures will, and it has been verified that the cooling rate in the temperature range above 850° C affects the threshold field more strongly than the cooling rate in the temperature range below 850° C.

The above-mentioned is a method that relates to a single crystal cooled from above the segregation temperature of the single crystals of the gadolinium molybdate family in the crystal pull technique, but this method can be used to produce the single crystals of the gadolinium molybdate family having high transmission and low threshold field from single crystals of gadolinium molybdate family having high threshold field. In this case, before the cooling steps as mentioned above, a step in which the single crystal having high threshold field is heat-treated for a predetermined time in the temperature of immediately below the melting point of the single crystal is added.

That is, in the method of producing a single crystal of gadolinium molybdate having high transmission comprising the step of cooling at the cooling rate above 200° C./hr. in the temperature range of 900° – 700° C after growing gadolinium molybdate single crystal from the melt under the crystal pulling technique, the transmission approaches to the theoretical value as the cooling rate becomes large.

As the single crystal of the gadolinium molybdate produced thus has a sufficiently large transmission, homogeneity and a variation of a double refraction index of under $10^{-4}$, it is used for a stationally phase controlling optical element (the passive optical element), for example, a half-wavelength plate which can be used the same as mica, quartz.

On the other hand, when the gadolinium molybdate single crystal is used as a material of the electro-optical element (such as optical shutter, light modulator and color modulator) it is desired that beside the transmission that the threshold field is low, while the mobility is high (as mentioned above). It is effective that the cooling time of the single crystal after growing is short in efficiency of time from an industrial standpoint.

Therefore, as mentioned above, when the optical quality alone is necessary, that is, the single crystal is used in material for passive optical element, it is desirable to have large cooling in the temperature range that a crack is not entered in the single crystal and it is advantageous in industry. On the other hand, when it is necessary to consider both optical and electrical qualities that is, for material to be used for active optical elements, suitable cooling conditions are needed and along cooling times are necessary. Therefore, it is significant in industry to convert the single crystals of gadolinium molybdate family manufactured for passive optical element material into the active element material.

But in the single crystal manufactured by fast cooling for sufficiently large transmission, there are dislocations due to thermal stress, and dislocations due to segregation of vacancies, therefore the electrical and mechanical quality are not good. Consequently, by a thermal treatment at a suitable temperature, an elimination of the vacancies due to fast cooling is necessary, and moreover, by suitable cooling for sustaining optical quality and for avoiding as much as possible the occurrence of new dislocation is necessary.

That is, by such treatment, the single crystal having the high threshold field can be improved in optical, electrical and mechanical properties.

In actuality, the single crystal having high transmission and low threshold field could be produced with good reproducibility by applying the above conditions to the crystal production.

BRIEF DESCRIPTION OF THE DRAWINGS

The present invention will be understood by reference to the following detailed description and to the accompanying drawings, wherein:

FIG. 5 is a characteristic diagram representing the relationship between the cooling condition and the threshold field in the method of producing the single crystal of gadolinium molybdate according to the present invention;

FIG. 14 is a characteristic diagram representing the relationship between the cooling conditions and the threshold field in the method of producing the single crystal of gadolinium molybdate according to the present invention; and FIG. 15 is a characteristic diagram representing the relationship between the cooling condition and the transmission in the method of producing the single crystal of gadolinium molybdate according to the present invention.

DESCRIPTION OF THE PREFERRED EMBODIMENTS

Example 1

Figure 1:
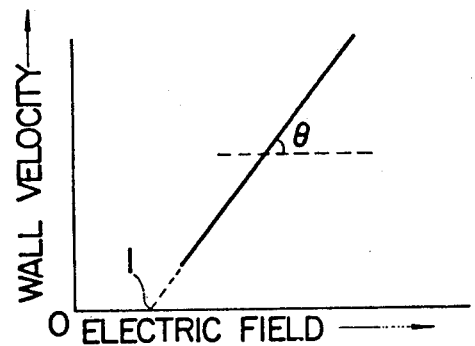
FIG. 1 is a diagram of the characteristic of the electric field wall velocity for explaining the threshold field and the mobility.
Figure 2:
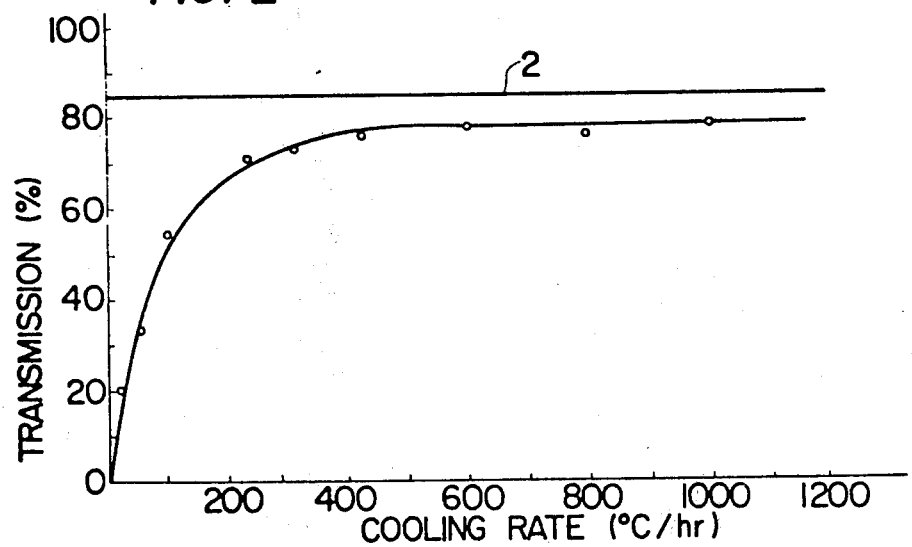
FIG. 2 is a diagram of the characteristic of cooling rate-transmission.

It has been understood from FIG. 2 that the light transmission is determined by the cooling rate in a temperature range below 850° C. in gadolinium molybdate. On the other hand, it is seen from FIG. 3 that in the case of cooling the crystal from about 1,000° C. down to the temperature immediately before the Curie point at the constant cooling rate, when the cooling rate is small the threshold field is small. Considering the crystal thermodynamically, it can be well conjectured that the cooling rate at high temperatures will have a greater influence on the threshold field than the cooling rate at low temperatures will as mentioned above. Therefore, attempts were made to produce the single crystal by variously changing the cooling rates in the temperature range below 850° C. and to measure the value of the threshold field, and it has been verified that the cooling rate in the temperature range above 850° C. affects the threshold field more strongly than the cooling rate in the temperature range below 850° C.

Quite likewise to the method mentioned above, the single crystal of gadolinium molybdate was grown, cut away from the melt and held at about 1,000° C. Thereafter, the single crystal was cooled at a constant cooling rate in the temperature range above 850° C., it was cooled at a greater constant cooling rate in a range of temperatures of 850° – 200° C., and it was cooled at the cooling rate of 120° C./hr. in a range of temperatures of 200° C. — the room temperature. This experiment was repeated numerously, and the relationship between the cooling conditions and the threshold field (as shown in FIG. 5) was obtained.

In the Figure, the axis of ordinates represents the cooling rates in the temperature range above 850° C., the axis of abscissas represents the cooling rates in the temperature range of 850° – 200° C., and numerical values represent the values of the threshold fields (in the unit of V/cm). Each of the values is a mean value by five or more trials, and has a dispersion of within ± 10%.

Figure 3:
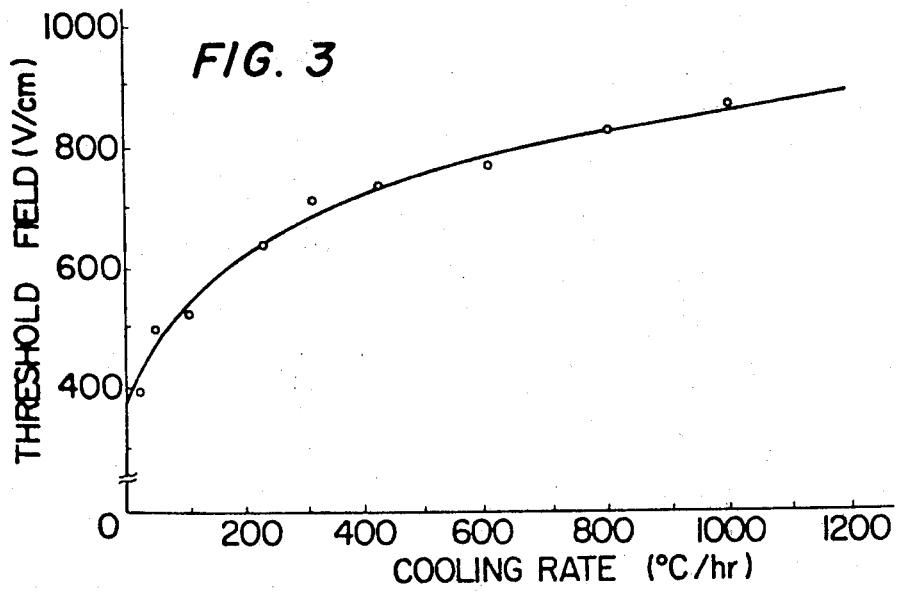
FIG. 3 is a diagram of the characteristic of cooling rate-threshold field.
Figure 4A:
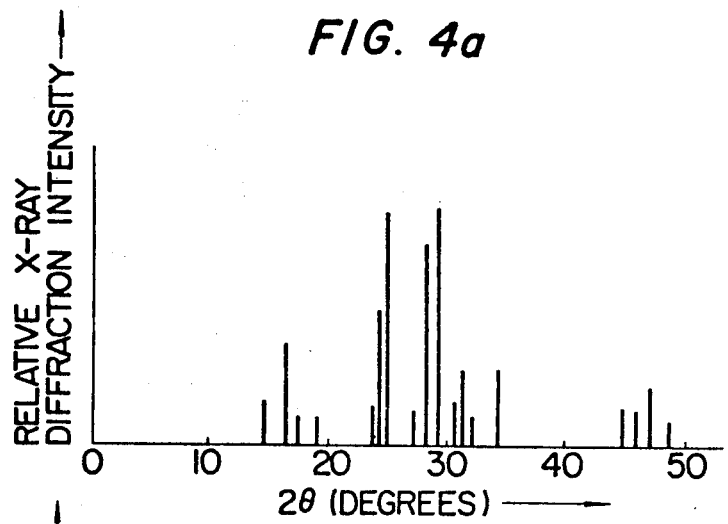
FIG. 4(a), 4(b) and 4(c) are diagrams of X-ray diffraction peaks of the single crystal at various cooling rates.
Figure 4B:
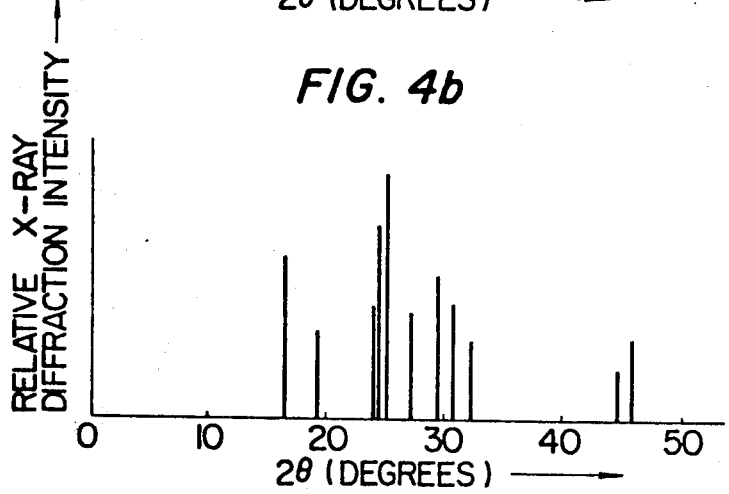
Figure 4C:
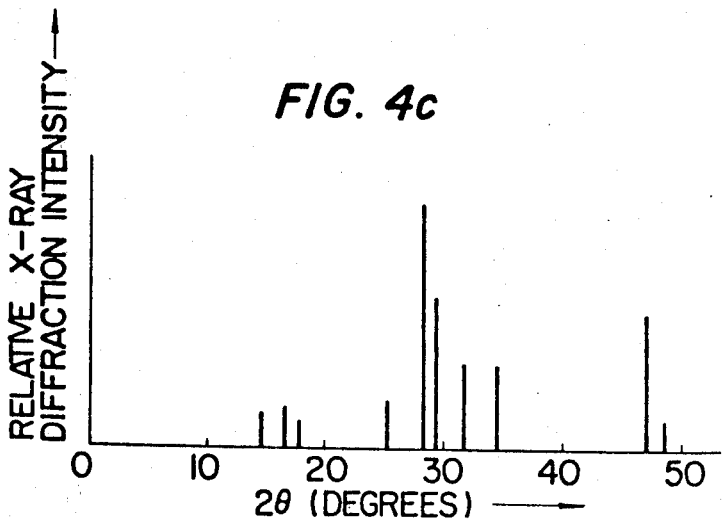

The marks ⊕ in the Figure denote the measured values in the case where the single crystal was cooled at the constant cooling rate from the high temperature to 200° C., that is, the measured values in FIG. 3.

As set forth previously, a transmission of at least 70% is generally required in case of employing the single crystal as the material of the electro-optical element. For this reason, the cooling rate in the temperature range of 850° – 200° C. need be greater than 250° C/hr. on the basis of the results shown in FIG. 2.

The value of the threshold field in the case of uniformly cooling the single crystal from about 1,000° C down to 200° C. at the cooling rate of at least 250° C/hr. is 650 V/cm or larger as seen from FIG. 3 or FIG. 5.

It is understood that, using cooling conditions which fall in a right portion with respect to straight line 3, in FIG. 5, and a lower portion with respect to a curve 4 (an equi-threshold-field curve of 650 V/cm), the value of the threshold field can be lowered to 500V/cm or so with the transmission maintained at 70% or higher.

Figure 6:
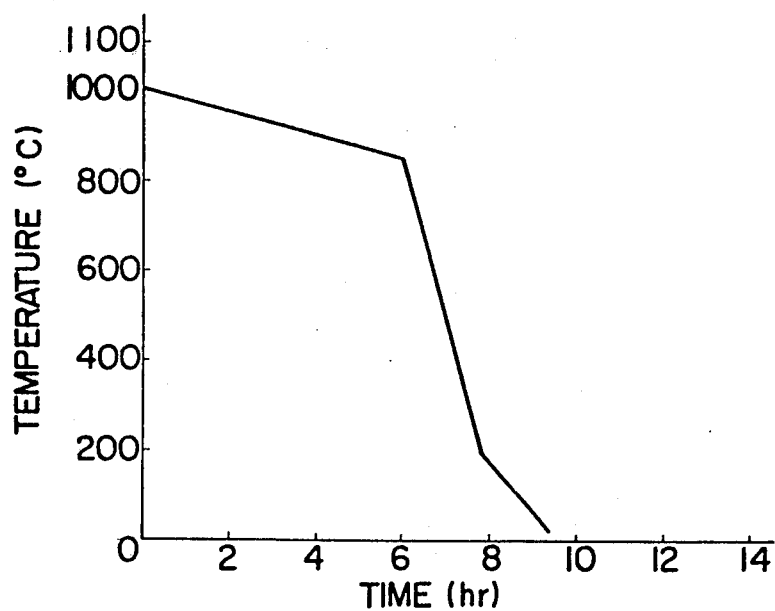
FIGS. 6, 7 and 8 are diagrams of the changes-with-time of the temperature, each illustrating cooling conditions in an example of the present invention.

That is to say, the single crystal being of good quality both optically and electrically is obtainable by the cooling conditions within a region A which is surrounded by the straight line 3, the curve 4 and the axis of abscissas in FIG. 5. For example, the point P indicates that the value of the threshold field is 530 V./cm at the time when the cooling rate is 25° C/hr. in the temperature range above 850° C. and 400° C./hr. in the temperature range of 850° – 200° C. The change-with-time of the temperature of the point P is illustrated in FIG. 6. On the other hand, the transmission of the point P has the saturation value of 78% as seen from FIG. 2.

Example 2

In the performance of Example 1, the cooling process after growing the single crystal was divided for the temperature ranges of (1) above 850° C, (2) 850° – 200° C and (3) below 200° C, and the cooling rates in the temperature ranges of (1) and (2) were changed variously. In the performance of the present example, the temperature ranges divided were of (1) above 850° C, (2) 850° – 500° C and (3) below 500° C.

Figure 7:
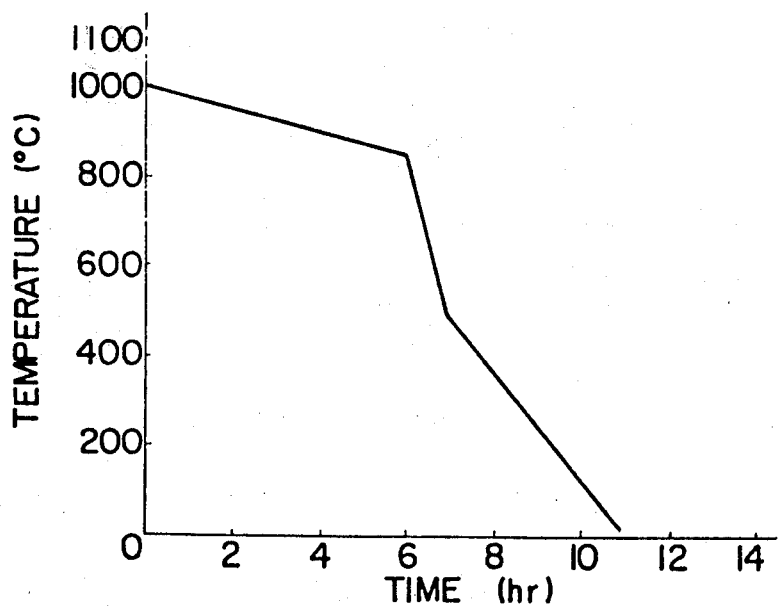

Quite likewise to the Example 1, the single crystal of gadolinium molybdate was grown, cut away from the melt and held at about 1,000° C. Thereafter, the single crystal was cooled (1) at the cooling rate of 25° C/hr. in the temperature range of above 850° C., (2) at the cooling rate of 400° C,/hr. in the temperature range of 500° C. — the room temperature. These cooling conditions are illustrated in FIG. 7. This trial was repeated five or more times.

When the threshold fields of the single crystal produced were measured, 500 V/cm ± 5 V/cm was obtained as the mean value of the threshold fields. By comparing this result with the value of the threshold field of 530 V/cm as obtained under the cooling conditions of the point P in FIG. 5 in Example 1, namely, under the changes-with-time of the temperature as shown in FIG. 6, a lowering in the threshold field amounting to approximately 30 V/cm is exhibited. On the other hand, the transmission was 76% or so.

Example 3

Figure 8:
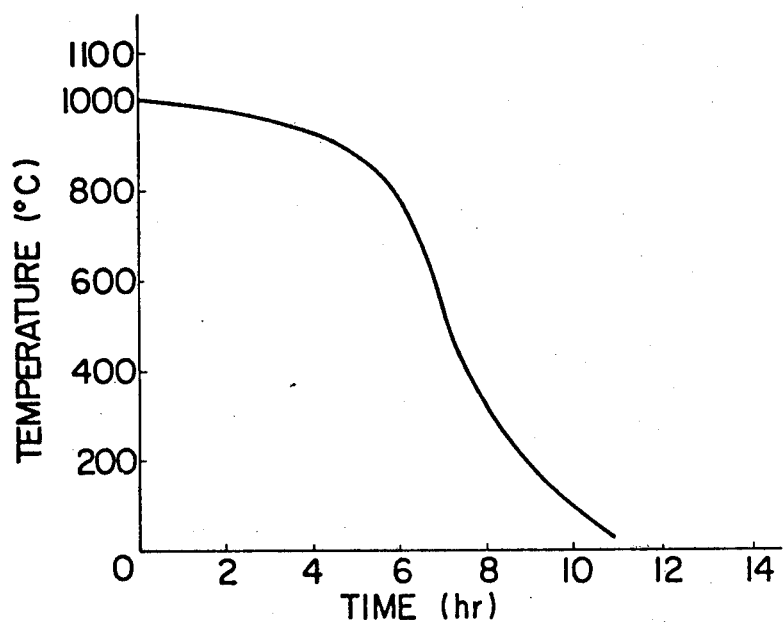

In a like manner, to Example 1 and Example 2, the single crystal of gadolinium molybdate was grown, cut away from the melt and held at about 1,000° C. Thereafter, curve-like temperature changes (as shown in FIG. 8) into which the straight line-like temperature changes in Example 2 were smoothed were bestowed on the single crystal.

This experiment was tried five or more times, and in consequence, threshold field and transmission results equivalent to or better than those in Example 2 were achieved.

Example 4

The above examples illustrate a cooling condition which was maintained at about 1,000° C. after growing of the single crystal of gadolinium molybdate. In this Example, the single crystal gadolinium molybdate grown in the crystal pull technique and being at about 1,000° C. is cut away from the melt and is transferred to a thermal resistance furnace placed in the upper part of the growing device and is maintained at a suitable temperature time at immediately below the melting point.

Figure 9:
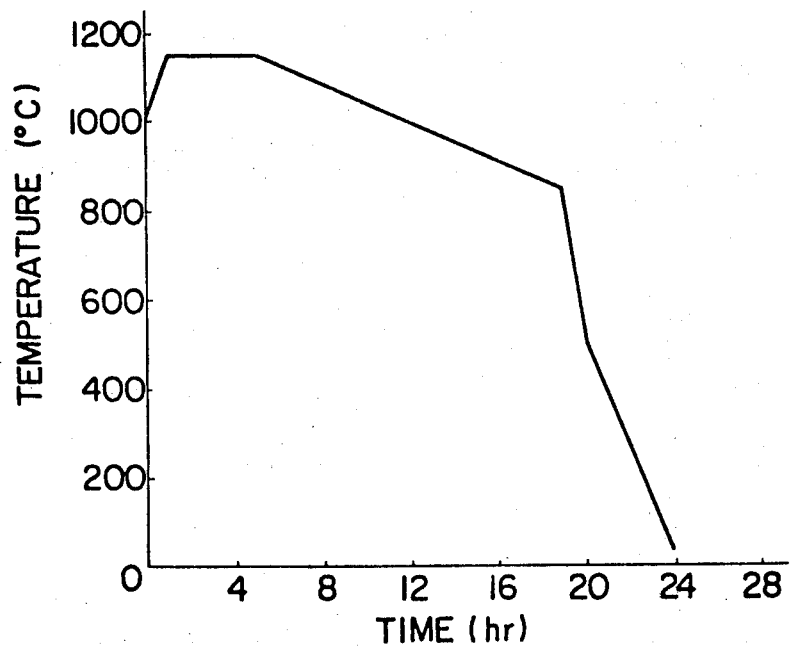
FIGS. 9, 10 and 11 are other diagrams of the changes-with-time of the temperature, each illustrating cooling conditions in an example of the present invention.

This is, the single crystal gadolinium molybdate is grown as in the above Examples. The single crystal at about 1,000° C temperature and cut away from the melt after growing was transferred slowly to the thermal resistance furnace being provided in the upper part of the growing device and maintained at a temperature range of 1140° – 1150° C. After being maintained for about four hours in the thermal resistance furnace, the single crystal was cooled at the cooling rate of 25° C./hr. in the temperature range of above 850° C (i.e. from about 1,150° – 850° C.), at the cooling rate 400° C./hr. in the temperature range of 850° – 500° C. and the cooling rate of 120° C./hr. in the temperature range of 500° C. — the room temperature. The thermal maintenance and cooling conditions are illustrated in FIG. 9. This trial was repeated five times.

When the threshold field and transmission of the single crystal produced were measured, 380 V/cm as the mean value of the threshold fields, and 76% as the mean value of the transmissions were, respectively, obtained. By comparing this result with the value of the threshold field of 500V/cm as obtained in Example 1, a decrease of 120 V/cm was shown. While as in this case the cooling condition under 850° C was similar with Example 1, the transmission was 76% with no change.

Therefore, the process to cooling after maintaining the single crystal for 4 hours at the temperature range of 1,140° – 1,150° C. is effective to improve the threshold field and the single crystal obtained was good optically.

Example 5

In the above Examples, the cooling rate in the temperature range 200° C — room temperature was constant at about 120° C./hr. This cooling rate is due to that the gadolinium molybdate has the ferroelectric and ferroelastic phase transition point at about 160° C.; hence, the change of thermal expansion at neighboring 160° C. is large (S. E. Cummins; *Ferroelectrics* 1 [1970] p. 11 – 17), therefore, when the cooling rate is as large as about 160° C., cracks may be introduced in the single crystal.

In this Example, the experiments were carried out to examine an effect of the cooling rate in the temperature range of 200° C. — room temperature to the threshold field and the transmission, and the occurrence of cracks was not considered.

Figure 10:
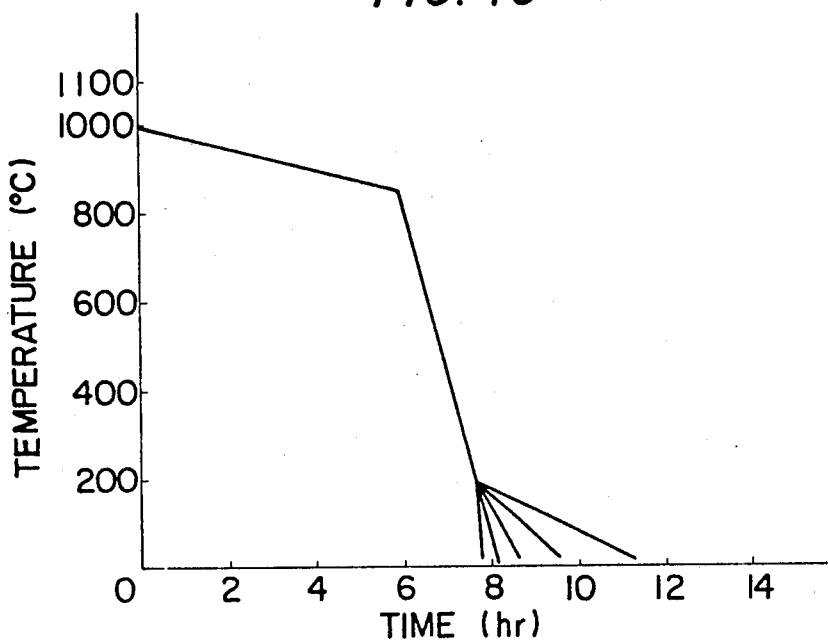

After the single crystal gadolinium molybdate was grown by the same process as used in the above Examples, the single crystal was maintained at 1,000° C.; thereafter, the single crystal was cooled at the cooling rate of 25° C./hr. in the temperature range of 1,000° – 850° C., at the cooling rate of 400° C./hr. in the temperature range of 850° – 200° C. and at five cooling rates of 50° C./hr., 100° C./hr., 200° C,/hr., 400° C./hr., 1,000° C./hr. in the temperature range of 200° C. — room temperature. This trial was repeated five times, respectively. FIG. 10 shows the results of these cooling conditions.

When the threshold field and the transmission of the single crystals obtained were measured, 530 V/cm ± 5 V for the threshold fields and 78% for the transmission was obtained, and the threshold field and the transmission in every cooling condition was nearly the same. From this Example, it is clear that the cooling rate in the temperature range of 200° C. — room temperature does not affect the threshold field and the transmission of the single crystal.

Example 6

Figure 11:
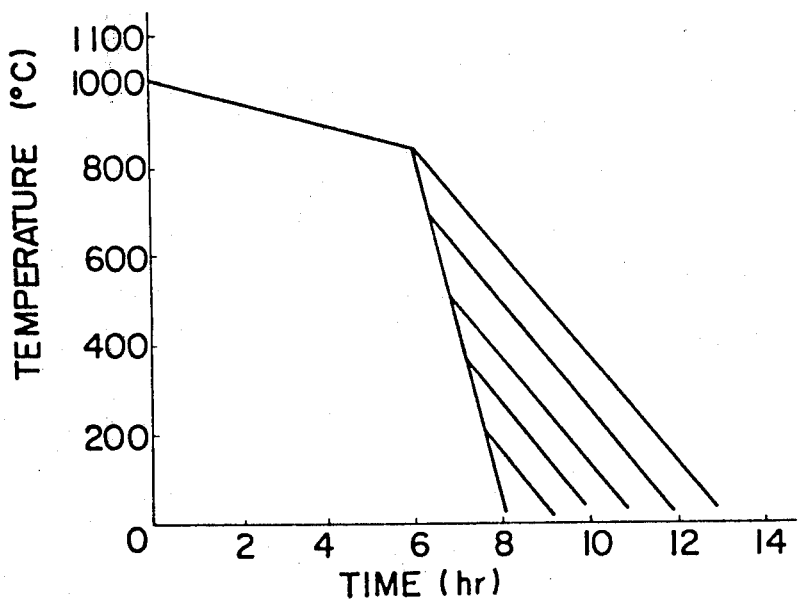
Figure 12:
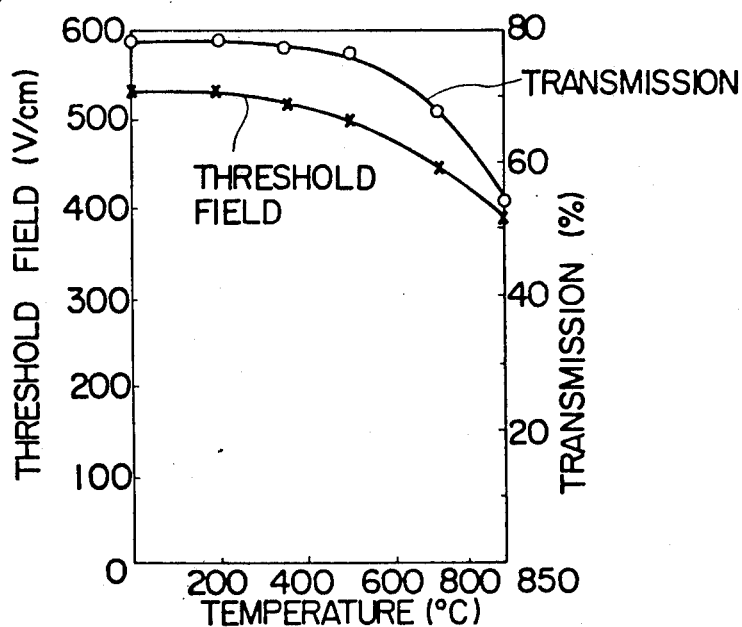
FIG. 12 is a characteristic diagram representing the relationship between the cooling condition in FIG. 11 and the threshold field and the transmission.

This Example is a variation of Examples 1 and 2. In this Example, the single crystal was cooled at the cooling rate of 25° C./hr. in the temperature range of 1,000° – 850° C, at the cooling rate of 400° C/hr. in the temperature range of 850° – T° C. (850° C > T > the room temperature), and at the cooling rate of 120° C/hr. in the temperature range of T° C — the room temperature. FIG. 11 shows the cooling conditions examined. FIG. 12 shows the relationship between the threshold field and the transmission of the single crystal obtained and the temperature T° C.

From these results it is clear that the threshold field decreases and becomes good electrically, as the temperature T° C. becomes higher; on the other hand the transmission decreases, and becomes bad optically.

Example 7

Powder containing 1 mole of gadolinium oxide and 3 moles of molybdenum oxide compounded together was sufficiently ground and mixed. In a platinum crucible, the powder was gradually heated for at least 36 hours in a high frequency heating single crystal pulling apparatus, and it was melted at 1,160° C. Subsequently, a seed crystal having [110] direction was fixed to a platinum holder, and it was immersed in the melt. While the holder was being rotated at the number of revolutions of 120 r.p.m., it was pulled up at the pull-up rate of 10 mm/hr. to grow a thick plate-like single crystal of gadolinium molybdate being about 10 mm in thickness, about 25 mm in width and about 60 mm. in length. Thereafter the single crystal was cut away from the melt. After the crystal was held at about 1,000° C., the heat source in the heating device cut off and thereafter the single crystal was cooled at the cooling rate of 2,000° C/hr. in the temperature of about 850° C., at the cooling rate of 1,000° C./hr. in the temperature of about 5,000° C., at the cooling rate of 200° C/hr. in the temperature of about 200° C. That is, the single crystal was cooled naturally at the cooling condition having an exponential function, i.e., having a large cooling rate at or in the high temperature. The trial was repeated 20 times, and 15 single crystals were obtained.

The transmission of the single crystal thus obtained was shown 78% ± 1% in the transmission as relative the transmissive light quantity to the incident light quantity per 1 cm in thickness and the threshold field of the single crystal thus obtained was shown 900 ± 10 V/cm. Here, for the measurements of the transmission, a He-Ne laser having an output of 5mW and a wavelength of 6328 Å was used as a light source, and the thickness of specimens was made 1 cm. For the measurements of the threshold field in the wall transfer, LiCl liquid electrode, the pulse voltage and memoryscope were used. The sample used was the single crystal which had a thickness made 0.8 mm by cutting away and polishing.

Next, many prism-like sngle crystals being about 5 × 8 × 10 mm were cut out from the single crystal thus obtained. These cut out singlecrystals were held in a platinum box in an electric resistance furnace having an inner furnace temperature that was nearly uniform. Subsequently, after these single crystals were heated at the heating rate of 200° C./hr. until a certain temperature under the melting point and were held a proper time at this temperature, the single crystal was cooled at the cooling rate of 25° C./hr., in the temperature range of until about 850° C., at the cooling rate of 400° C./hr. in the temperature range of 850° – 200° C. and at the cooling rate of 120° C./hr. in the temperature range of 200° C. — the room temperature.

When the transmission of the single crystal treated as mentioned above was measured again, 77% ± 2% was obtained as the mean value of the transmission; this value does not change from before carrying out the heating and cooling treatment. It is recognized that the optical quality can be sustained sufficiently. Here the example used in the experiment was an optically polished {001} surface of the prism single crystal.

And 5 – 6 plate of the single crystal of which the thickness was 0.8 mm. were cut away and polished. The threshold field was measured by the method mentioned above. The mean values measured in the case of thermal treatment of certain temperature and times are shown in FIG. 13.

Figure 13:
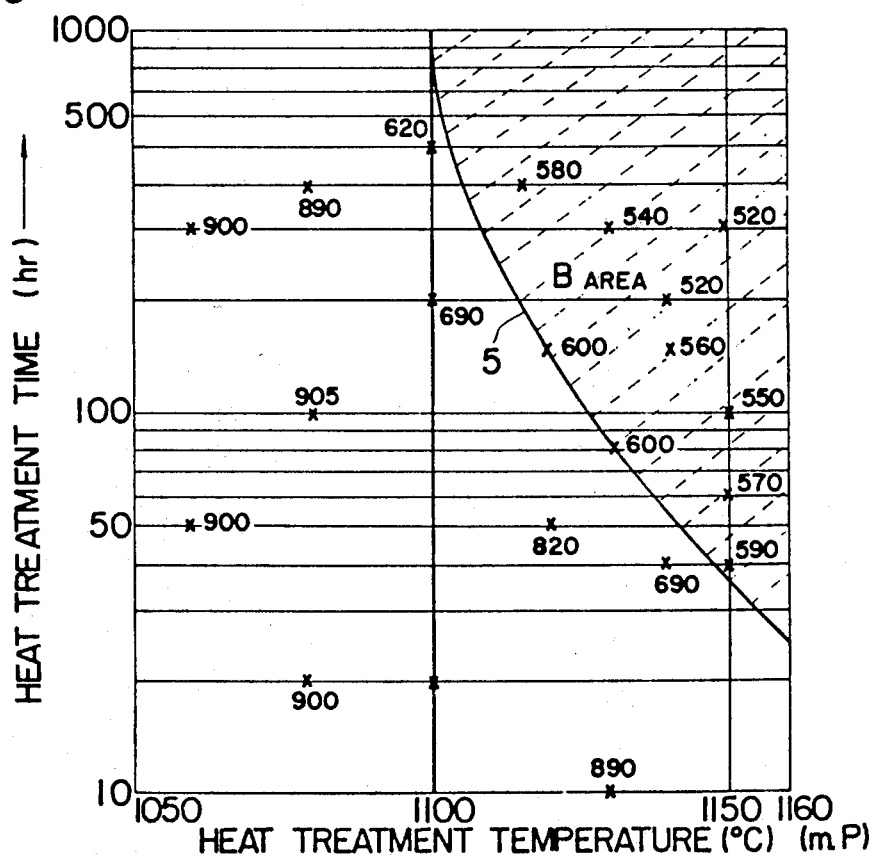
FIG. 13 is a characteristic diagram representing the relationship between the heat treatment temperature and the heat treatment time in improving the single crystal of large threshold field according to the present invention.

The threshold field of the single crystal gadolinium molybdate before giving the heating and cooling treatment was 900 ± 10 V/cm. but as clear from FIG. 13, when the treatment range is selected in area B surrounded by curve 5, the threshold field can be decreased remarkably. The area B illustrated that the range can be decreased, for example, under ⅔ of the threshold field.

Example 8

As in Example 7, a single crystal gadolinium molybdate was grown and cooled, and from the single crystal, 20 single crystals having dimensions of about 10 mm in thickness, about 25 mm in width and about 60 mm in length were provided. The single crystals provided thus had the transmission in relative transmissive light quantity to incident light quantity (thereafter it is called the relative transmission) per 1 cm in thickness of 78% ± 10%, and a threshold field of 900 ± 10 V/cm (it was measured by the single crystal of 0.8 mm in thickness).

Further, from these single crystals, many single crystals having about 5 × 8 × 10 mm in size were cut away and were held in the platinum box of the electric resistance furnace having an inner furnace temperature that was nearly uniform. After the temperature was increased gradually until 1,150° C. by the furnace, the single crystal was cooled at the various cooling rates in the temperature range above 850° C and 850° – 200° C, respectively, then at the cooling rate at 120° C/hr. in the 200° C — the room temperature.

As in Example 7, the heat treated prism-like single crystal obtained was measured for the relative transmission, and further the single crystals were made to a single crystal plate of 0.8 mm in thickness and the threshold field was measured.

FIG. 14 illustrates the relative transmission per 1 cm, and FIG. 15 illustrates the threshold field of the single crystal plate of 0.8 mm in thickness.

In this case, the cooling rate under 200° C. is fixed at 120° C./hr. because it is necessary to cool at a cooling rate of under 200° C./hr. so that when the single crystal passes through the ferroelectric and ferroelastic transition point at 160° C., the single crystal is not destroyed. This is due to the fact that cooling conditions under 200° C. do not affect the character as mentioned above.

It is clear from FIG. 15 that the cooling rate of over 250° C,/hr. is necessary for the relative transmission to be over 70%.

From the above results and measurement values shown in FIG. 14 it is clear that the range of cooling conditions required so that the relative transmission is over 70% and the threshold field is under 600 V/cm is range A' in FIG. 14. In the range, except the range A', the relative transmission is under 70% or the threshold field is over 600 V/cm.

In this Example, the temperature range for cooling was divided by the 3 steps of the melting point — 850° C, 850° – 200° C., 200° C. — the room temperature, and the cooling rate is afforded suitably in each step. But it can be used to any variation that the α phase is not precipitated and the value of the threshold field is not made large.

That is, it is clear that the dislocations entered into the single crystals gadolinium molybdate by fast cooling are eliminated by maintaining suitable times at the temperature immediately below the melting point; moreover, decrease of the transmission in cooling due to the occurrence of dislocation can be avoided as much as possible and may improve the electric and mechanical quality, and especially the feature of wall domain transition.

The Examples mentioned above illustrated the case of gadolinium molybdate, but it will be understood that this invention is applicable to the isomorphous substances of the gadolinium molybdate structure such as samarium molybdate ($Sm_2(MoO_4)_3$), europium molybdate ($Eu_2(moO_4)_3$), dysprosium molybdate ($Dy_2(MoO_4)_3$) and terbium molybdate ($Tb_2(MoO_4)_3$). And the temperature of the transition to the α phase is, respectively, 940° C., 880° C., 770° C., and 800° C.

It will be appreciated from the above examples that the cooling rates are governed in part by the temperature ranges under consideration. For example, in the preferred embodiment shown in FIG. 5, the cooling rate above 850° C. is less than 250° C./hr. and the cooling rate in the temperature range of from 850° to 200° C. is from 250° to 1,100° C./hr.

Also, it will further be understood that the single crystals of the gadolinium molybdate family obtained by this invention will have transmission values over about 70% and threshold field values of under about 650 V/cm.

While the invention has been described by reference to particular embodiments thereof, it will be understood that numerous and further modifications may be made by those skilled in the art without actually departing from the invention. Therefore, the appended claims are to cover all such equivalent variations that fall within the true spirit and scope of the foregoing disclosure.

What is claimed is:

1. A method for producing a single crystal selected from the group consisting of gadolinium molybdate, samarium molybdate, europium molybdate, dysprosium molybdate and terbium molybdate comprising growing a single crystal from a melt having a chemical composition corresponding to the chemical composition of said crystal by a crystal pulling technique, cooling said single crystal in accordance with an exponential function, maintaining said cooled single crystal at a temperature immediately below the melting point of said single crystal for a time and temperature within the area B of FIG. 13 of the drawings, cooling said single crystal at a cooling rate less than 250° C/hr. in the temperature range of from immediately below the melting point of said single crystal to the β-α transition temperature of said single crystal, and cooling said single crystal at a cooling rate of about 250 to 1,100° C/hr. in the temperature range below the β-α transition temperature of said single crystal.

2. The method of claim 1, wherein said single crystal is gadolinium molybdate, and further wherein the cooling rate in the temperature range of from 850° C. to 200° C. is in area A in FIG. 5 of the drawings.

3. The method of claim 1, wherein said single crystal is cooled at a rate of about 250° to 1,100° C./hr. from about the β-α transition temperature of said single crystal to a temperature immediately above the Curie point of said single crystal.

4. The method of claim 1, wherein said sngle crystal is exponentially cooled down to a temperature of at least about 200° C. and thereafter heated up to said temperature immediately below the melting point of said single crystal.

5. A method for improving the threshold field properties of a single crystal selected from the group consisting of gadolinium molybdate, samarium molybdate, europium molybdate, dysprosium molybdate and terbium molybdate and formed by the Czochralski crystal pulling technique comprising:
   heating up and maintaining said single crystal at an elevated temperature within the area B of FIG. 13 of the drawings,
   cooling the single crystal at a constant rate less than about 250° C/hr. over the temperature range of about 1,000° C. to the approximate β-α transition temperature of said single crystal,
   cooling the single crystal thus cooled at a rate of about 250° to 1,000° C./hr. from the approximate β-β transition temperature of said single crystal to immediately above the Curie temperature of said crystal, and
   cooling the single crystal thus produced from immediately above the Curie temperature of said single crystal to room temperature at a rate sufficiently low to prevent the introduction of cracks into said single crystal.

* * * * *